United States Patent
Jun et al.

(10) Patent No.: US 7,235,922 B2
(45) Date of Patent: Jun. 26, 2007

(54) PLASMA DISPLAY PANEL WITH POROUS PAD

(75) Inventors: Jae Hong Jun, Sasang-ku (KR); Jin Young Kim, Dalseo-ku (KR); Yong Song, Kumi-shi (KR); Deok Soo Kim, Kumi-shi (KR); Won Tae Kim, Kumi-shi (KR); Chul Hwan Lee, Joong-ku (KR); Hae Young Jung, Bapyong-ku (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/612,874

(22) Filed: Jul. 7, 2003

(65) Prior Publication Data

US 2004/0119410 A1    Jun. 24, 2004

(30) Foreign Application Priority Data

Jul. 6, 2002    (KR) ...................... 10-2002-0039179

(51) Int. Cl.
*H01J 17/49*    (2006.01)
(52) U.S. Cl. ...................... 313/582; 313/634
(58) Field of Classification Search ............... 313/582, 313/46, 590, 634, 238; 315/169.4; 362/294; 361/681, 688, 800, 816, 831; 445/24, 25
See application file for complete search history.

(56) References Cited

U.S. PATENT DOCUMENTS

| | | | | |
|---|---|---|---|---|
| 5,971,566 A | * | 10/1999 | Tani et al. | 362/294 |
| 6,288,489 B1 | * | 9/2001 | Isohata et al. | 313/582 |
| 6,310,767 B1 | * | 10/2001 | Spear et al. | 361/681 |
| 6,560,124 B1 | * | 5/2003 | Irie et al. | 361/816 |
| 6,617,767 B2 | * | 9/2003 | Juen | 313/44 |
| 6,700,315 B2 | * | 3/2004 | Kim et al. | 313/46 |
| 6,737,790 B2 | * | 5/2004 | Seki | 313/47 |
| 6,794,026 B2 | * | 9/2004 | Ebihara et al. | 428/319.1 |

FOREIGN PATENT DOCUMENTS

| | | |
|---|---|---|
| JP | 2000-3137 | 1/2000 |
| KR | 2002-21481 | 3/2002 |

* cited by examiner

*Primary Examiner*—Nimeshkumar D. Patel
*Assistant Examiner*—Kevin Quarterman
(74) *Attorney, Agent, or Firm*—McKenna, Long & Aldridge

(57) ABSTRACT

A plasma display panel adapted to minimize noise/vibration as well as a heat generated therefrom. In the plasma display panel, a display panel displays a picture while a porous pad is provided behind the display panel to prevent the transfer of noise/vibration to an associated heat proof panel. When the PDP is mounted within a case, a second porous pad can be provided on an inner surface of the case opposite the display panel and adjacent to an associated printed circuit board for additional noise/vibration damping.

41 Claims, 6 Drawing Sheets

PLASMA DISPLAY PANEL WITH POROUS PAD

BACKGROUND OF THE INVENTION

1. Field of the Invention

This invention relates to a plasma display panel and, more particularly, to a plasma display panel that is adaptive for minimizing noise/vibration and heat generated therefrom.

2. Description of the Related Art

Recently, various flat panel devices have been developed that reduce weight and bulk, which are drawbacks of the cathode ray tube (CRT). Such flat panel display devices include a liquid crystal display (LCD), a field emission display (FED), a plasma display panel (PDP) and an electro-luminescence display (ELD), etc.

The PDP of these flat panel display devices allows an ultraviolet ray, generated upon discharge of an inactive mixed gas, such as He+Xe, Ne+Xe or He+Xe+Ne, etc., to radiate a phosphorous material to thereby display a picture. The PDP has been used for high-resolution television, monitors and as an internal or external advertising display because it has a rapid response speed and is suitable for displaying a large-area picture.

FIG. 1A and FIG. 1B show the internal structure of the conventional plasma display panel.

Referring to FIG. 1A and FIG. 1B, the conventional PDP includes a display panel 2, a frame (or heatproof panel) 8, and a printed circuit board 16.

The display panel 2 includes a front substrate 6 and a rear substrate 4. The rear substrate 4 is coated with a phosphorous material (not shown). The front substrate 6 transmits light generated from the phosphorous material to thereby display a desired picture.

The rear substrate 4 of the display panel 2 is adhered with a double-faced tape 12 having high heat conductivity, by which the display panel 2 is joined with the frame 8. The double-faced tape 12 acts to transfer heat generated upon driving of the display panel 2 into the frame 8. Since such a double-faced tape 12 has high density and hardness to facilitate a high heat-conductivity function, it rapidly transfers heat generated upon driving of the display panel 2 into the frame 8. Accordingly, the frame 8 not only supports the display panel, but also discharges heat.

The printed circuit board 16 is attached to the frame 8 to supply the display panel 2 with a desired driving signal. To this end, the printed circuit board 16 and the display panel 2 are connected to a flexible printed circuit (FPC) (not shown). Further, the printed circuit board 16 and the frame 8 are engaged with a plurality of screws 10. To this end, the frame 8 includes a plurality of protrusions 14 into which the screws 10 can be inserted.

As shown in FIG. 2, such a conventional PDP is provided with a set case 20 to enclose the PDP when it is produced. The set case 20 includes a filter glass 18 and a back cover 17. The filter glass 18 controls transmittivity of the light emitted from the display panel 2, while the back cover 17 protects the PDP from external impact.

In the conventional PDP, heat generated upon driving of the display panel 2 as well as vibration and resulting noise are transferred, via the double-faced tape 12, to the frame 8. In other words, the noise/vibration generated upon driving of the display panel 2 are caused, at least partly, by physical factors within the display panel 2 itself. More specifically, ions generated from the rear substrate 4 and the front substrate 6 are opposed with each other, having barrier ribs therebetween which, upon plasma discharge, are bombarded along with the front substrate 6. In this case, when the height of the barrier ribs is not uniform, causing a stepped coverage between the barrier ribs and the front substrate 6, vibration is generated between the stepped barrier ribs and the front substrate 6 by the collision force of the ions. Due to the vibration of the barrier ribs within the discharge cells and the front substrate 6, noise/vibration is generated throughout the entire display panel 2.

As described above, heat generated upon driving of the display panel 2 is discharged, via the double-faced tape 12, to the frame 8, whereas noise/vibration generated upon driving of the display panel 2 superposes with noise/vibration generated from electronic components mounted onto the printed circuit board 16. In other words, noise/vibration generated from the display panel 2 is easily propagated, via the double-faced, high-density tape 12, into the frame 8 to superpose with noise/vibration generated from the printed circuit board 16. As a result, rear noise/vibration of the PDP is greatly increased in comparison with noise/vibration generated from the printed circuit board 16 itself.

SUMMARY OF THE INVENTION

Accordingly, it is an object of the present invention to provide a plasma display panel that is adaptive for minimizing noise/vibration generated therefrom.

A further object of the present invention is to provide a plasma display panel that is adaptive for minimizing heat generated therefrom.

In order to achieve these and other objects of the invention, a plasma display panel according to an embodiment of the present invention includes a display panel for displaying a picture; and a porous pad provided at the display panel.

Herein, the porous pad is made of a material that absorbs noise/vibration and conducts heat.

The plasma display panel further includes a printed circuit board mounted with a plurality of integrated circuits for applying driving signals to the display panel; and a heatproof panel arranged between the porous pad and the printed circuit board.

The plasma display panel further includes a double-faced tape having a heat-conducting function and provided between the display panel and the porous pad.

The plasma display panel further includes a filter glass provided at the front side of the display panel to control transmittivity of light emitted from the display panel; and a back cover for covering the printed circuit board.

The plasma display panel further includes a second porous pad provided between the printed circuit board and the back cover.

Herein, the porous pad is formed from a mixture of a silicon material and a foam agent.

Herein, the foam agent contains an urethane foam.

The plasma display panel further includes an adhesive coated onto the porous pad.

Herein, the adhesive is made from an acrylic material.

Herein, the porous pad is formed from a mixture containing approximately 89% silicon, approximately 10% foam agent and approximately 1% adhesive.

Herein, the second porous pad is made of a material that absorbs noise/vibration.

A plasma display panel according to another aspect of the present invention includes a display panel for displaying a picture; a frame adjacent a rear surface of said display panel; a printed circuit board adjacent a rear surface of said frame and connected thereto by fastening elements; and a porous pad positioned between said display panel and said frame, said porous pad absorbing noise/vibration generated upon driving of said display panel to minimize noise/vibration transferred to said frame.

Herein, said porous pad is made of a heat-conducting material that, in addition to absorbing noise/vibration, also enables said pad to transfer heat from said display panel to said frame.

Herein, said porous pad is made of a mixture of silicon and urethane.

Herein, said porous pad has an outer adhesive layer and is adhered to said display panel and to said frame by said layer.

Herein, said porous pad is made of approximately 89% silicon, 10% foam agent, and 1% adhesive.

The plasma display panel further includes an outer casing surrounding said plasma display panel, said outer casing having a back cover and a front cover, said back cover including a second porous pad adhered to an inner surface thereof adjacent said printed circuit board, said second porous pad absorbing noise/vibration generated as a result of said printed circuit board applying driving signals to said display panel.

The plasma display panel further includes an outer casing surrounding said plasma display panel, said outer casing having a back cover and a front cover, said back cover including a second porous pad adhered to an inner surface thereof adjacent said printed circuit board, said second porous pad absorbing noise/vibration generated as a result of said printed circuit board applying driving signals to said display panel.

Herein, said porous pad is made of a mixture of silicon and urethane that, in addition to absorbing noise/vibration, also enables said pad to transfer heat from said display panel to said frame.

Herein, said porous pad has an outer layer of acrylic adhesive by which said pad is adhered to said display panel and to said frame, said porous pad being approximately 89% silicon, 10% foam agent, and 1% adhesive.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1A:
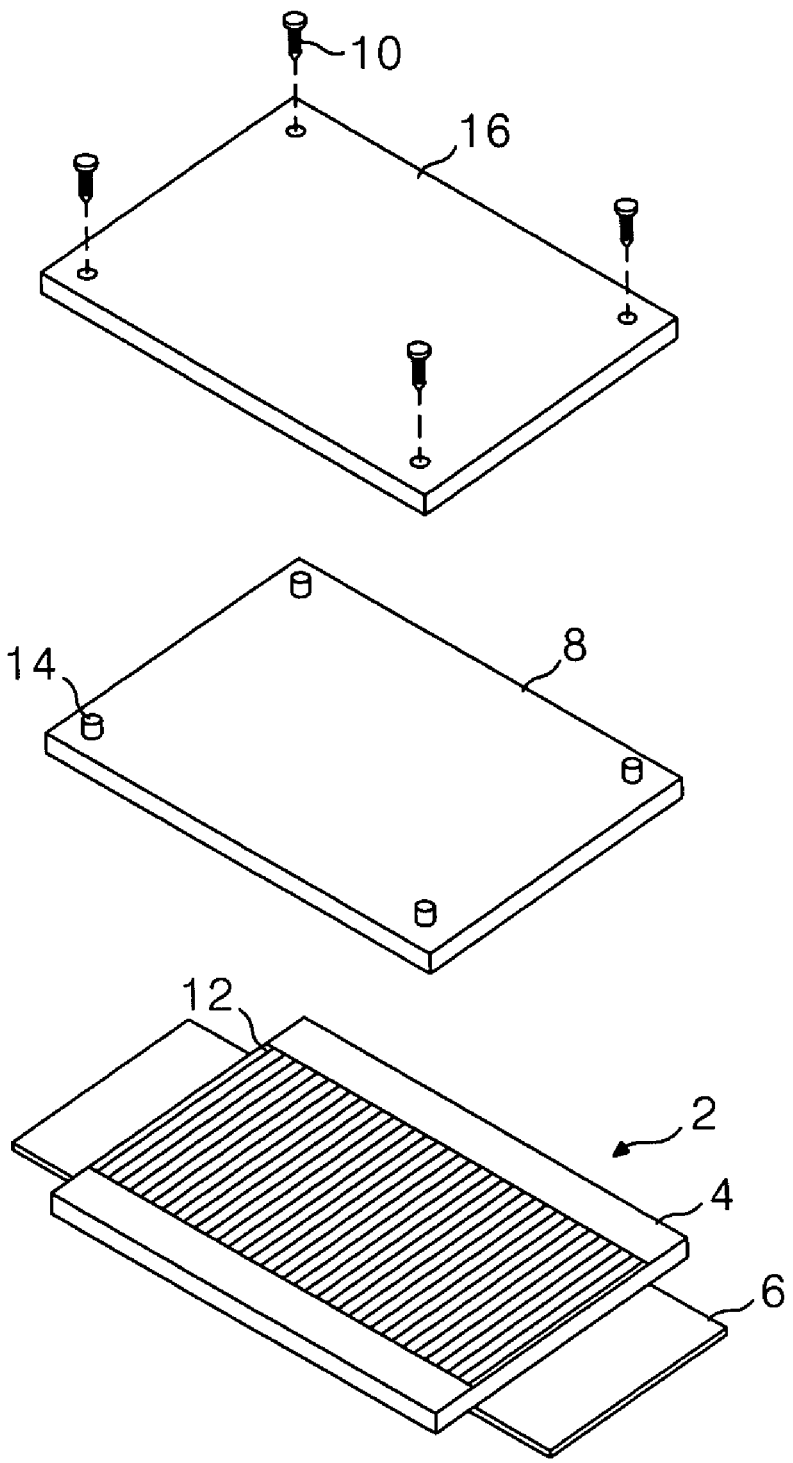
FIG. 1A and FIG. 1B illustrate an internal structure of a conventional plasma display panel.
Figure 1B:
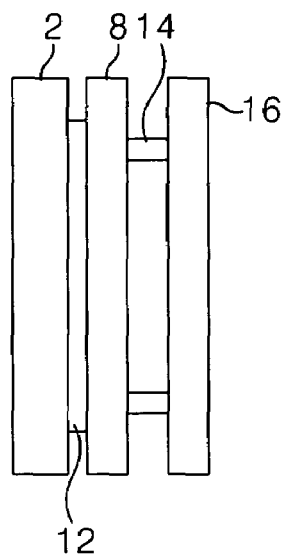
Figure 2:
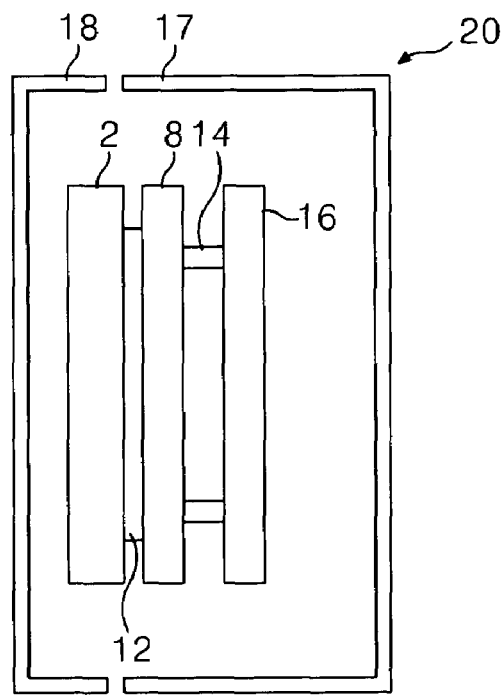
FIG. 2 shows the conventional display panel of FIG. 1B installed within a set case.
Figure 3A:
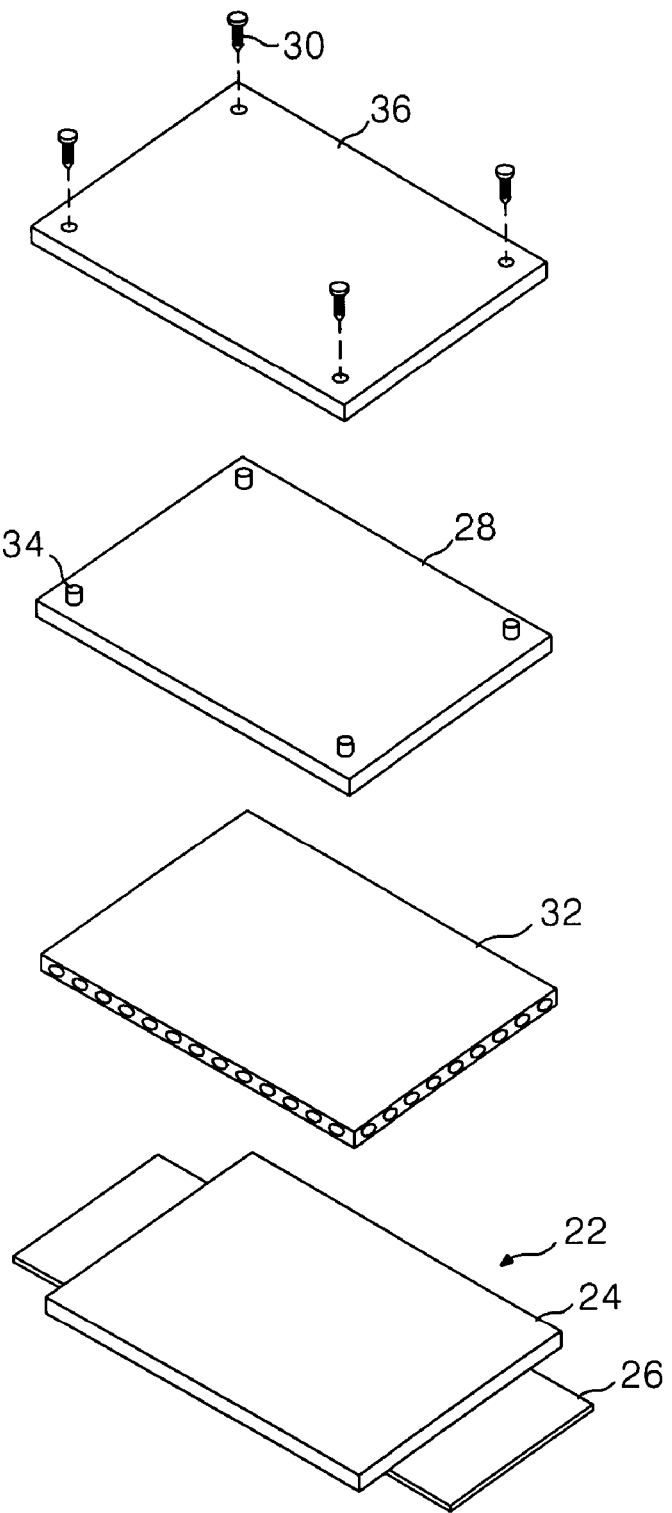
FIG. 3A is an exploded perspective view representing an internal structure of a plasma display panel according to a first embodiment of the present invention.
Figure 3B:
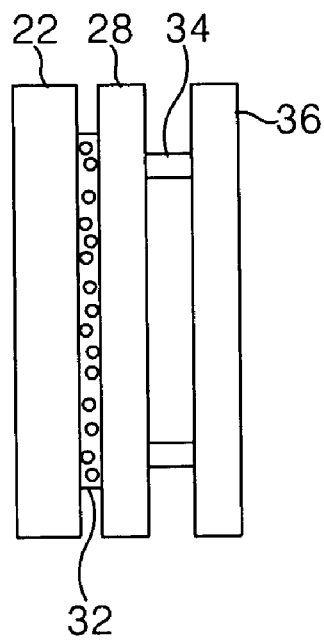
FIG. 3B is a section view representing the internal structure of a plasma display panel according to the first embodiment of the present invention.

Referring to FIG. 3A and FIG. 3B, a plasma display panel (PDP) according to a first embodiment of the present invention includes a display panel 22 for displaying a picture, a frame (or heat-proof panel) 28, a porous pad 32 for preventing noise/vibration generated from the display panel 22 from being transferred to the frame 28; and a printed circuit board 36.

The display panel 22 includes a front substrate 26 and a rear substrate 24. The rear substrate 24 is coated with a phosphorous material (not shown). The front substrate 26 transmits light generated from the phosphorous material to thereby display a desired picture.

The rear substrate 24 of the display panel 22 is adhered with a porous pad 32, by which the display panel 22 is joined with the frame 28. Since the porous pad 32 has a function of absorbing noise and vibration, it absorbs and shields against propagation of noise/vibration, generated upon driving of the display panel 22, to the frame. Also, since the porous pad 32 has a heat conducting function, it transfers heat, generated upon driving of the display panel 22, to the frame 28. Herein, the noise/vibration generated upon driving of the display panel 22 are caused by physical factors within the display panel 22. More specifically, ions generated from the rear substrate 24 and the front substrate 26 are opposed with each other, having barrier ribs therebetween which, upon plasma discharge, are bombarded along with the front substrate 26. In this case, when the height of the barrier ribs is not uniform, causing a stepped coverage between the barrier ribs and the front substrate 26, vibration is generated between the stepped barrier ribs and the front substrate 26 by the collision force of the ions. Due to the vibration of the barrier ribs within the discharge cells and the front substrate 26, noise/vibration is generated throughout the entire display panel 22. Accordingly, the porous pad 32, formed from a porous type material having a low density and a low hardness, is provided for absorbing noise/vibration generated from the display panel 22

Figure 4:
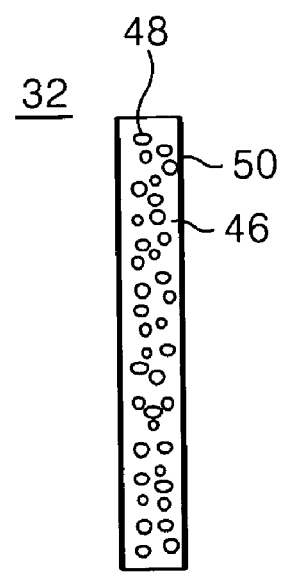
FIG. 4 is a section view of the porous pad shown in FIG. 3A and FIG. 3B.

As shown in FIG. 4, the porous pad 32 is made by mixing silicon 46 with a foam agent 48 to prepare a pad and then coating an adhesive 50 onto the front surface and the rear surface of the prepared pad. At this moment, the foam agent 48 contains urethane foam. Accordingly, porous materials are formed at the interior of the silicon 46 of the pad by the urethane foam included in the foam agent 48. An acrylic material is used as the adhesive 50 coated on the front surface and the rear surface of the pad. In this case, the porous pad 32 contains approximately 89% silicon, approximately 10% foam agent 48 and approximately 1% adhesive. The porous material formed by the foam agent 48 contained in the porous pad 32 absorbs noise/vibration propagated from the display panel 22. Further, heat generated upon driving of the display panel 22 is transferred, via the silicon 46 contained in the porous pad 32, to the frame 28 to thereby discharge the heat generated from the display panel. Moreover, the porous pad 32 absorbs any external impact by its porous materials.

The printed circuit board 36 is attached to the frame 28 to supply the display panel 22 with a desired driving signal. To this end, the printed circuit board 36 and the display panel 22 are connected to each other by a flexible printed circuit (FPC) (not shown). Further, the printed circuit board 36 and the frame 28 are engaged with a plurality of screws 30. To this end, the frame 28 includes a plurality of protrusions 34 into which the screws 30 can be inserted.

Figure 5:
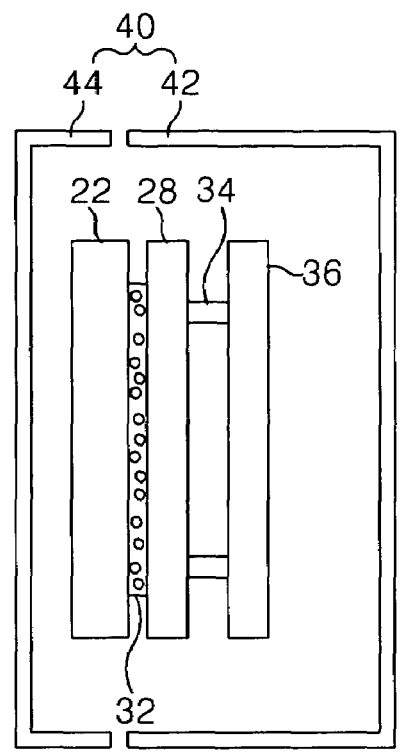
FIG. 5 is a section view showing the plasma display panel of FIG. 3B according to the first embodiment of the present invention, as installed within a set case.

As shown in FIG. 5, such a PDP according to the first embodiment of the present invention is provided with a set case 40 to enclose the PDP when it is produced. The set case 40 includes a filter glass 44 and a back cover 42. The filter glass 44 controls the transmittivity of light emitted from the display panel 22. The back cover 42 protects the PDP from external impact.

In the PDP according to the first embodiment of the present invention, the porous pad 32, attached between the display panel 22 and the frame 28, can absorb noise/vibration generated upon driving of the display panel 22 to prevent the transfer of noise/vibration into the frame 28, thereby minimizing the noise/vibration. Accordingly, noise/vibration at the rear surface of the PDP is limited to that generated by the printed circuit board 36 itself because the noise/vibration from the display panel 22 is damped by the porous pad 32.

Furthermore, the PDP according to the first embodiment of the present invention can discharge heat generated upon driving of the display panel 22 because such heat is transferred, via the porous pad 32, to the frame 28.

Figure 6:
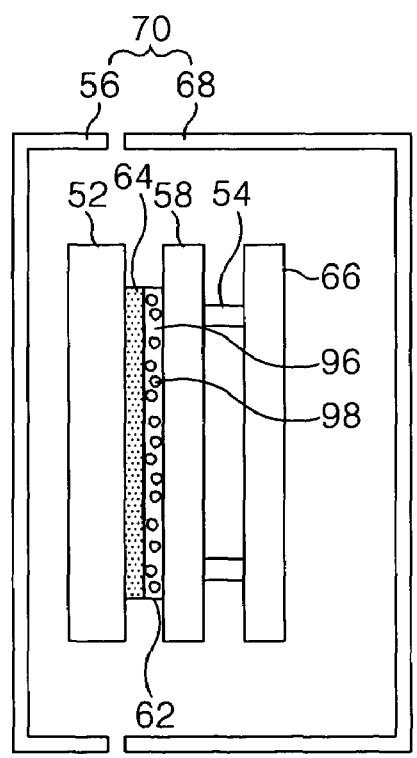
FIG. 6 is a section view representing an internal structure of a plasma display panel according to a second embodiment of the present invention.

Referring to FIG. 6, a plasma display panel (PDP) according to a second embodiment of the present invention includes a display panel 52 for displaying a picture, a frame (or heat-proof panel) 58, a heat-conductive double-faced tape 64 provided between the display panel 52 and the frame 58, a porous pad 62 provided between the heat-conductive double-faced tape 64 and the frame 58 to prevent noise/vibration generated from the display panel 52 from being transferred to the frame 58, and a printed circuit board 66.

The display panel 52 includes a front substrate and a rear substrate (not shown). The rear substrate is coated with a phosphorous material (not shown). The front substrate transmits light generated from the phosphorous material to thereby display a desired picture.

The rear substrate of the display panel 52 is adhered with the heat-conductive double-faced tape 64, by which the display panel 52 is joined with the frame 58. The heat-conductive double-faced tape 64, made of a material having high density and hardness to rapidly transfer heat, acts to transfer heat, generated upon driving of the display panel 52, to the frame 58. Accordingly, the frame 58 not only supports the display panel, but also discharges heat upon driving of the display panel 52.

The porous pad 62 joins the heat-conductive double-faced tape 64 with the frame 28. Since the porous pad 62 has a function of absorbing noise and vibration, it absorbs and shields against propagation of noise/vibration, generated upon driving of the display panel 52, via the heat-conductive double-faced tape 64, to the frame 58. Also, since the porous pad 62 has a heat conducting function, it transfers heat delivered through the heat-conductive double-faced tape 64 to the frame 58. To this end, the porous pad 62 is formed from a porous type material having a low density and a low hardness.

The porous pad 62 is made by mixing silicon 96 with a foam agent 98 to prepare a pad and then coating an adhesive 80 onto the front surface and the rear surface of the prepared pad. At this moment, the foam agent 98 contains urethane foam. Accordingly, porous materials are formed at the interior of the silicon 96 of the pad by the urethane foam included in the foam agent 98. An acrylic material is used as the adhesive 80 coated on the front surface and the rear surface of the pad. In this case, the porous pad 62 contains approximately 89% silicon 96, approximately 10% foam agent 98 and approximately 1% adhesive. The porous material formed by the foam agent 78 contained in the porous pad 62 absorbs noise/vibration propagated from the display panel 52. Further, heat generated upon driving of the display panel 52 is transferred, via the silicon 96 contained in the porous pad 62, to the frame 58 to thereby discharge the heat generated from the display panel 52. Moreover, the porous pad 52 absorbs any external impact by its porous materials.

The printed circuit board 66 is attached to the frame 58 to supply the display panel 52 with a desired driving signal. To this end, the printed circuit board 66 and the display panel 52 are connected to each other by a flexible printed circuit (FPC) (not shown). Further, the printed circuit board 66 and the frame 58 are engaged with a plurality of screws (not shown). To this end, the frame 58 includes a plurality of protrusions 54 into which the screws can be inserted.

Such a PDP according to the second embodiment of the present invention is provided with a set case 70 to enclose the PDP when it is produced. The set case 70 includes a filter glass 56 and a back cover 68. The filter glass 56 controls the transmittivity of light emitted from the display panel 52. The back cover 68 protects the PDP from any external impact.

In the PDP according to the second embodiment of the present invention, the porous pad 62 attached between the display panel 52 and the frame 58 can absorb noise/vibration generated upon driving of the display panel 52 to prevent the transfer of noise/vibration into the frame 58, thereby minimizing the noise/vibration. Accordingly, noise/vibration at the rear side of the PDP is limited to that generated by the printed circuit board 66 itself because the noise/vibration from the display panel 52 is damped by the porous pad 62.

Furthermore, the PDP according to the second embodiment of the present invention can discharge heat generated upon driving of the display panel 52 because such heat is transferred, via the heat-conductive double-faced tape 64 and the porous pad 62, to the frame 58.

Figure 7:
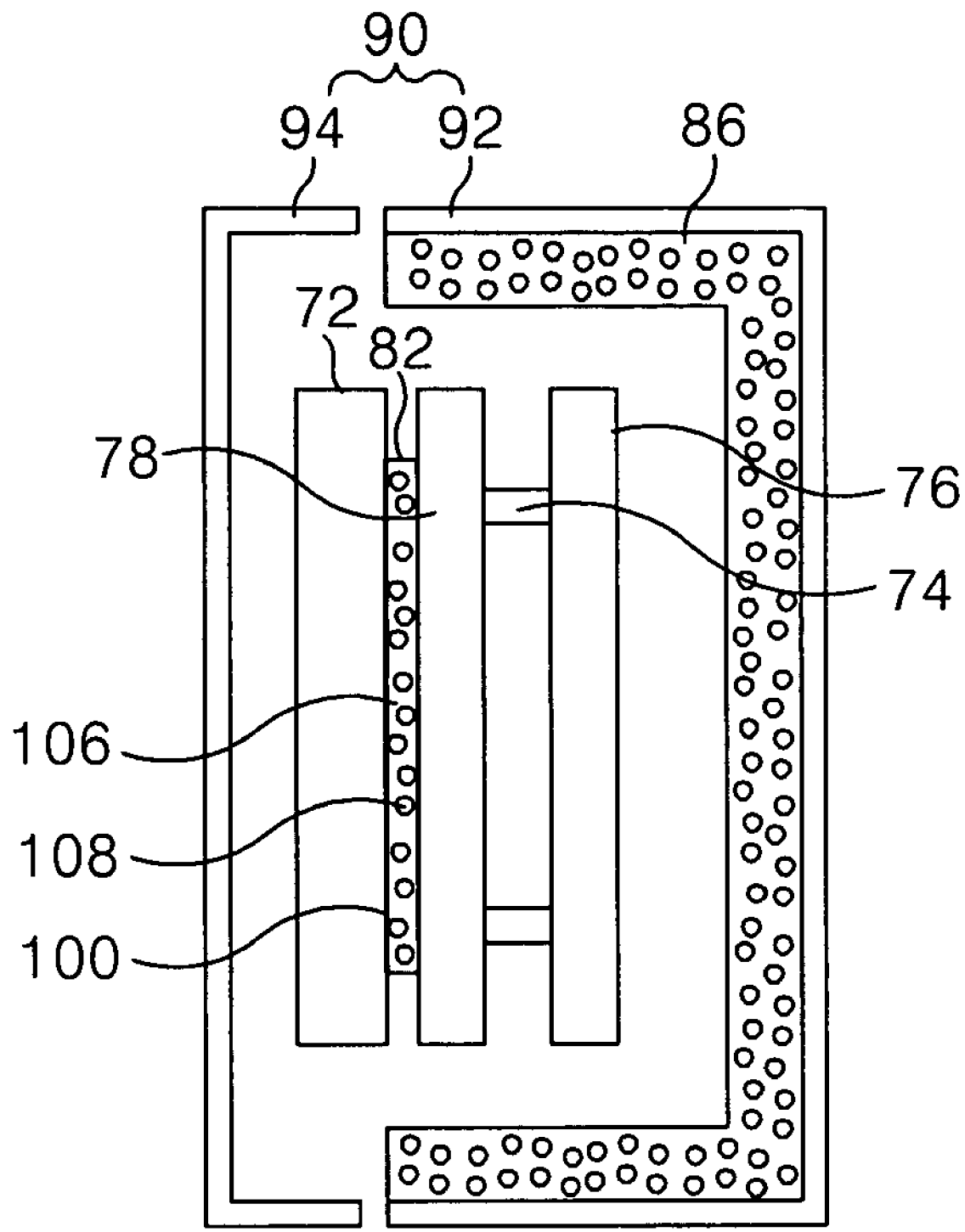
FIG. 7 is a section view representing an internal structure of a plasma display panel according to a third embodiment of the present invention.

Referring to FIG. 7, a plasma display panel (PDP) according to a third embodiment of the present invention includes a display panel 72 for displaying a picture, a frame (or heat-proof panel) 78, a first porous pad 82 for preventing noise/vibration generated from the display panel 72 from being transferred to the frame 78, and a printed circuit board 76.

The display panel 72 includes a front substrate and a rear substrate (not shown). The rear substrate is coated with a phosphorous material (not shown). The front substrate transmits light generated from the phosphorous material to thereby display a desired picture.

The rear substrate of the display panel 72 is adhered with the first porous pad 82, by which the display panel 72 is joined with the frame 78. Since the first porous pad 82 has a function of absorbing noise and vibration, it absorbs and shields against propagation of noise/vibration, generated upon driving of the display panel 72, to the frame 78. Also, since the first porous pad 82 has a heat conducting function, it transfers heat generated upon driving of the display panel 72 to the frame 78. To this end, the first porous pad 82 is formed from a porous type material having a low density and a low hardness.

The first porous pad 82 is made by mixing silicon 106 with a foam agent 108 to prepare a pad and then coating an adhesive 100 onto the front surface and the rear surface of the prepared pad. At this moment, the foam agent 108 contains urethane foam. Accordingly, porous materials are formed at the interior of the silicon 106 of the pad by the urethane foam included in the foam agent 108. An acrylic material is used as the adhesive 100 coated on the front surface and the rear surface of the pad. In this case, the first porous pad 82 contains approximately 89% silicon, approximately 10% foam agent 108 and approximately 1% adhesive. The porous material formed by the foam agent 108 contained in the first porous pad 82 absorbs noise/vibration propagated from the display panel 72. Further, heat generated upon driving of the display panel 72 is transferred, via the silicon 106 contained in the first porous pad 82, to the frame 78 to thereby discharge the heat generated from the display panel 72. Moreover, the first porous pad 82 absorbs any external impact by its porous materials.

The printed circuit board 76 is attached to the frame 78 to supply the display panel 72 with a desired driving signal. To this end, the printed circuit board 76 and the display panel 72 are connected to each other by a flexible printed circuit (FPC) (not shown). Further, the printed circuit board 76 and the frame 78 are engaged with a plurality of screws (not shown). To this end, the frame 78 includes a plurality of protrusions 74 into which the screws can be inserted. Due to the driving of electronic elements mounted onto the printed circuit board 76, noise/vibration is generated at the printed circuit board 76.

Such a PDP according to the third embodiment of the present invention is provided with a set case 90 to enclose the PDP when it is produced. The set case 90 includes a filter glass 94 and a back cover 92. The filter glass 94 controls the transmittivity of light emitted from the display panel 72. The back cover 92 protects the PDP from any external impact.

Further, a second porous pad 86 for damping noise/vibration generated from the printed circuit board 76 is provided at the inner side of the back cover 92 opposed to the printed circuit board 76. Since the second porous pad 86 has a function of absorbing noise/vibration, it is identical to the above-mentioned first porous pad 82, absorbing noise/vibration generated from the printed circuit board 76.

In the PDP according to the third embodiment of the present invention, the first porous pad 82 attached between the display panel 72 and the frame 78 can absorb noise/vibration generated upon driving of the display panel 72 to prevent the transfer of noise/vibration into the frame 78, thereby minimizing the noise/vibration. Furthermore, the second porous pad 86, having the function of absorbing noise/vibration, absorbs noise/vibration generated as a result of the printed circuit board 76 applying driving signals to the display panel 72.

As described above, according to the present invention, the porous pad is provided between the display panel and the frame to thereby absorb and damp noise/vibration generated upon driving of the display panel. Accordingly, it becomes possible to minimize the generation of noise from the PDP.

Although the present invention has been explained by the embodiments shown in the drawings described above, it should be understood to the ordinary skilled person in the art that the invention is not limited to the specific embodiments shown, but rather that various changes or modifications thereof are possible without departing from the spirit of the invention. Accordingly, the scope of the invention shall be determined only by the appended claims and their equivalents.

What is claimed is:

1. A plasma display panel, comprising:
    a display panel for displaying a picture; and
    a porous pad made of a material that absorbs noise/vibration and conducts heat provided at the display panel, the material including silicon and a foam agent, wherein a percentage amount of silicon is greater than a percentage amount of the foam agent.

2. The plasma display panel as claimed in claim 1, further comprising:
    a circuit board mounted with a plurality of integrated circuits for applying driving signals to the display panel; and
    a heatproof panel arranged between the porous pad and the circuit board.

3. The plasma display panel as claimed in claim 1, further comprising:
    a double-faced tape having a heat-conducting function and provided between the display panel and the porous pad.

4. The plasma display panel as claimed in claim 2, further comprising:
    a filter glass provided at the front side of the display panel to control transmittivity of light emitted from the display panel; and
    a back cover for covering the circuit board.

5. The plasma display panel as claimed in claim 4, further comprising:
    a second porous pad provided between the circuit board and the back cover.

6. The plasma display panel as claimed in claim 1, wherein the foam agent contains an urethane foam.

7. The plasma display panel as claimed in claim 1, further comprising:
    an adhesive coated onto the porous pad.

8. The plasma display panel as claimed in claim 7, wherein the adhesive is made from an acrylic material.

9. The plasma display panel as claimed in claim 7, wherein the material is formed from a mixture containing approximately 89% silicon, approximately 10% foam agent and approximately 1% adhesive.

10. The plasma display panel as claimed in claim 5, wherein the second porous pad is made of a material that absorbs noise/vibration.

11. A plasma display panel comprising:
    a display panel for displaying a picture;
    a frame adjacent a rear surface of said display panel;
    a circuit board adjacent a rear surface of said frame and connected thereto by fastening elements; and
    a porous pad made of a material that absorbs noise/vibration and conducts heat positioned between said display panel and said frame, the material including silicon and a foam agent, wherein a percentage amount of silicon material is greater than a percentage amount of the foam agent.

12. The plasma display panel as set forth in claim 11, wherein the foam agent is urethane.

13. The plasma display panel as set forth in claim 12, wherein said porous pad has an outer adhesive layer and is adhered to said display panel and to said frame by said layer.

14. The plasma display panel as set forth in claim 13, wherein said material is made of approximately 89% silicon, 10% foam agent, and 1% adhesive.

15. The plasma display panel as set forth in claim 14, further comprising an outer casing surrounding said plasma display panel, said outer casing having a back cover and a front cover, said back cover including a second porous pad adhered to an inner surface thereof adjacent said circuit board, said second porous pad absorbing noise/vibration generated as a result of said circuit board applying driving signals to said display panel.

16. The plasma display panel as set forth in claim 11, further comprising an outer casing surrounding said plasma display panel, said outer casing having a back cover and a front cover, said back cover including a second porous pad adhered to an inner surface thereof adjacent said circuit board, said second porous pad absorbing noise/vibration generated as a result of said circuit board applying driving signals to said display panel.

17. The plasma display panel as set forth in claim 16, wherein said porous pad has an outer layer of acrylic adhesive by which said porous pad is adhered to said display panel and to said frame, said material being approximately 89% silicon, 10% foam agent, and 1% adhesive.

18. A plasma display device, comprising:
a display panel for displaying a picture;
a frame for supporting the display panel; and
a porous pad attached between the display panel and the frame, wherein the porous pad includes silicon and an urethane foam, the percentage amount of silicon being larger than the percentage amount of urethane foam.

19. The plasma display device as claimed in claim 18, further comprising:
a double-sided tape for a thermal conduction between the display panel the porous pad.

20. The plasma display device as claimed in claim 18, further comprising:
a circuit board attached to the frame;
a back cover covering the circuit board; and
a second porous pad provided between the circuit board and the back cover.

21. The plasma display device as claimed in claim 18, further comprising an adhesive coating on the porous pad.

22. The plasma display device as claimed in claim 21, wherein the adhesive is made from an acrylic material.

23. A plasma display device comprising:
a display panel for displaying a picture;
a frame for supporting the display panel;
a porous pad between the display panel and the frame, the porous pad including a silicon material and a foam agent; and
a double-sided tape for a thermal conduction between the display panel and the porous pad, wherein a percentage of the silicon material is greater than a percentage of the foam agent.

24. The plasma display device as claimed in claim 23, wherein the porous pad further includes an adhesive.

25. The plasma display device as claimed in claim 24, wherein the adhesive is made from an acrylic material.

26. A plasma display device comprising:
a display panel for displaying a picture;
a frame for supporting the display panel;
a circuit board attached to the frame;
a back cover for covering the circuit board; and
a porous pad located between the circuit board and the back cover, the porous pad including silicon mixed with a foam agent, wherein a percentage amount of silicon is greater than a percentage amount of the foam agent.

27. The plasma display device as claimed in claim 26, wherein the foam agent is an urethane foam.

28. The plasma display device as claimed in claim 26, wherein the porous pad further includes an adhesive.

29. The plasma display device as claimed in claim 28, wherein the adhesive is made from an acrylic material.

30. A plasma display device comprising:
a display panel for displaying a picture;
a frame for supporting the display panel;
a porous pad disposed between the display panel and the frame, the porous pad including an urethane foam and a silicon material, a percentage of silicon material in the porous pad being greater than a percentage of the urethane foam.

31. The plasma display device as claimed in claim 30, wherein the porous pad further includes an adhesive.

32. The plasma display device as claimed in claim 31, wherein the adhesive is made from an acrylic material.

33. A method of manufacturing a plasma display device that includes a display panel, a rear frame, and driving circuits, the method comprising:
attaching a porous pad to the rear frame, said porous pad being made by mixing a silicon material with a foam agent, the concentration of the silicon material being greater than the concentration of the foam agent; and
arranging the display panel on the porous pad, the porous pad being positioned between the display panel and the rear frame.

34. The method of claim 33, further comprising:
coating a rear surface of the porous pad with an adhesive material, the adhesive material attaching the porous pad to the rear frame.

35. The method of claim 34, wherein the adhesive material is an acrylic material.

36. The method of claim 33, further comprising:
coating a front surface of the porous pad with an adhesive material, wherein the adhesive material attaches the porous pad to the display panel.

37. The method of claim 36, wherein the adhesive material is an acrylic material.

38. The method of claim 33, further comprising:
applying a heat conductive double-sided tape to a front surface of the porous pad, wherein the heat conductive double-sided tape attaches the porous pad to the display panel.

39. The method of claim 38, wherein the display panel includes a rear substrate, and wherein arranging the display panel on the porous pad comprises:
attaching the porous pad to the rear substrate of the display panel using the heat conductive double-sided tape.

40. The method of claim 33, further comprising:
attaching a printed circuit board to the rear frame, the printed circuit board including the plasma display driving circuits.

41. The method of claim 33, wherein the porous pad is approximately 89 percent silicon.

* * * * *